United States Patent [19]
Keil

[11] Patent Number: 6,134,975
[45] Date of Patent: Oct. 24, 2000

[54] TESTING ELEMENT

[75] Inventor: Mathias Keil, Lutherstadt Eisleben, Germany

[73] Assignee: Cybertron Gesselschaft für Automation und Quälitatsanalyse mbH, Germany

[21] Appl. No.: 09/187,287

[22] Filed: Nov. 5, 1998

[30] Foreign Application Priority Data

Nov. 5, 1997 [DE] Germany .......................... 197 48 844

[51] Int. Cl.[7] .................................................. G01M 19/00
[52] U.S. Cl. .................. 73/865.8; 73/865.9; 356/243.1; 356/401
[58] Field of Search ................ 73/865.8, 865.9, 73/1.79; 437/118, 107, 15; 356/243.1, 401; 33/645; 438/118, 107, 15

[56] References Cited

U.S. PATENT DOCUMENTS

| | | | |
|---|---|---|---|
| 4,557,599 | 12/1985 | Zimring | 356/243 |
| 5,247,844 | 9/1993 | Howell | 73/865.8 |
| 5,537,204 | 7/1996 | Woodhouse . | |
| 5,942,078 | 8/1999 | Abrahamson | 73/432.1 |

FOREIGN PATENT DOCUMENTS 4227667   2/1994   Germany .

*Primary Examiner*—Hezron Williams
*Assistant Examiner*—Nashmiya Fayyaz
*Attorney, Agent, or Firm*—Robert W. Becker & Associates

[57] ABSTRACT

A testing element for detecting positioning and mounting tolerances during mounting of electronic components on a printed circuit board has a protective housing and a transparent base body mounted in the protective housing. The transparent base body has a top surface and a base surface. At least one of the base surface and the top surface has machine-readable markings. An adhesive is applied to the testing element for connecting the testing element to the testing board.

15 Claims, 3 Drawing Sheets

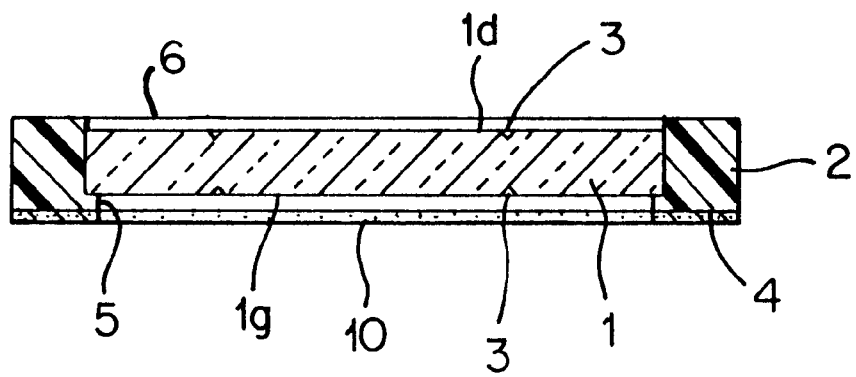
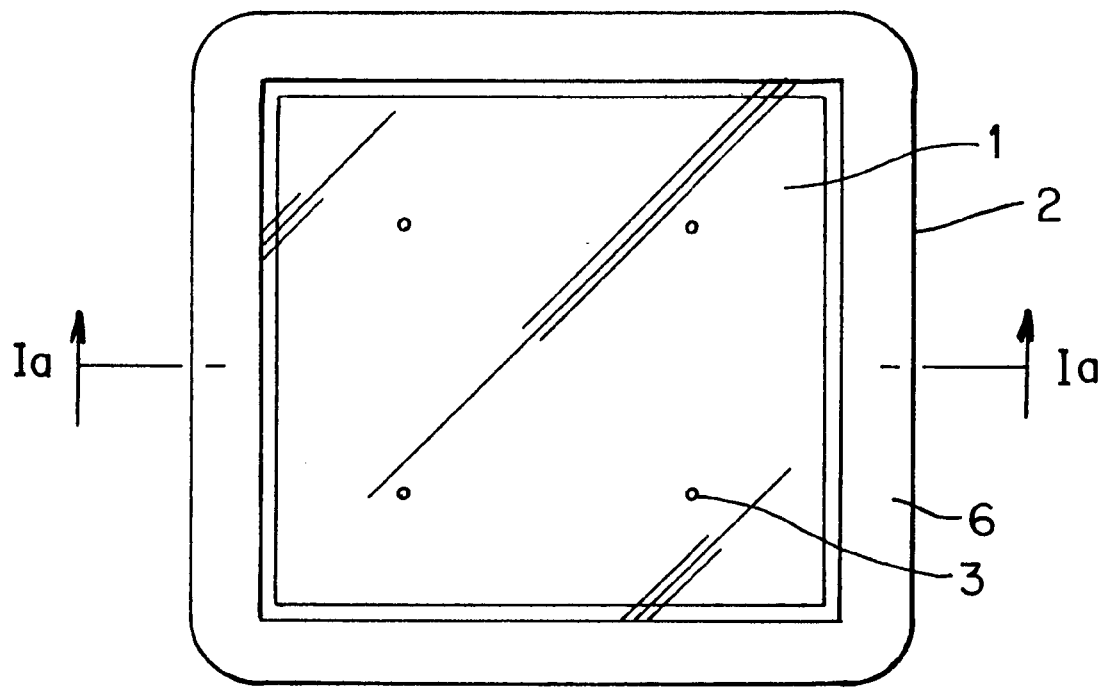

TESTING ELEMENT

BACKGROUND OF THE INVENTION

The present invention relates to a testing element for testing the positioning and mounting tolerances for fixation of electronic components on printed circuit boards by assembly robots.

The assembly of printed circuit boards and electronic or electric components and component groups by assembly robots may result in inexact positioning and resulting position deviations when placing the components on the printed circuit board because of mechanical, optical, or control-technological effects as well as subjective inputs by the operator. In order to ensure minimal positioning and mounting tolerances for assembly, it is therefore necessary to test the assembly robots in certain intervals.

Under real process conditions the achievable position exactness at the individual assembly points of a robot is subject to stochastic fluctuations the distribution of which cannot be in each case defined by known distribution functions. Thus, basic conditions for a sufficiently precise mathematical prognosis of the distribution of the mounting tolerances across the working area of the assembly robot are not available.

For determining the actual achievable mounting tolerances, it is therefore necessary to detect a large number of measuring points within the working area of the assembly robot by measuring-technological means. Subsequently, with the aid of correction programs, the nominal/actual deviation (variance) at each determined point of the working area can be determined and error correction can be performed.

There is the possibility to determine the processing quality of the assembly robot quantatively as well as qualitatively and to deduce therefrom the remaining service life or the latest point in time at which a new robot must be purchased.

For determining the nominal/actual deviations (variance) for the positioning of SMD components on a circuit board it is customary to employ dummies which are to be mounted under simulated, substantially process-identical conditions.

From German Patent Application 42 27 667 a means for measuring-technological detection of the assembly precision of assembly robots for SMD components is known in which the tolerances of real components is simulated by dummies. An actual printed circuit board is replaced by a testing board made of glass onto which the assembly robot places dummies of SMD components in the form of glass dummies. The single piece, parallelepipedal glass dummies have at their surface a coordinate system and additional markings at the corner points. Additionally, the surface of the glass dummies is provided with a plurality of graphic rasters which simulate the arrangement of pins of a real SMD component. With a corresponding dimensioning of the pin raster, the tolerance range for the photo-optical testing of the mounting precision of the SMD assembly robots can be defined.

The placement of test dummies onto the testing board allows for determination of the stochastically occurring positioning precision at all measuring points of the working area under real assembly conditions of the respective assembly robot.

An advantage of this solution is that the dummies (testing board and glass dummies) can be produced with much greater manufacturing tolerances than real printed circuit boards and components. A further advantage is that due to the minimal manufacturing tolerances the sensing precision of the markings on the testing board and the glass dummies is substantially higher than for real components.

In order to prevent a position change of the glass dummies on the testing board, the parts to be attached to one another are temporarily fixed. For this purpose the surface of the testing board is completely or selectively, by employing a mask, coated with a sprayable adhesive. In an alternative embodiment, the surface of the testing board is provided with a known double-sided adhesive foil. Subsequently, the parallelepipedal glass dummies are placed with their entire bottom surface area onto the coated surface of the glass printed circuit board.

This known method has the disadvantage that due to the non-homogenous properties of the adhesive as well as the flow tendency of the adhesive upon application of the adhesive onto the surface of the testing board it is impossible to provide a uniform, constant adhesive thickness.

Because of the viscosity of the adhesive layer into which the glass dummies upon placement onto the testing board are completely immersed with their bottom surface, after completion of placement flow processes occur which may result in a subsequent position change of the glass dummies on the testing board and thus in a falsification of the measuring results.

Another disadvantage is that the test dummies after completion of measurement and before a further testing series is started, must be completely freed of adhesive remains. Remaining particles of the adhesive and also dirt particles adhered thereto result in a contamination of the testing board which requires a complicated after treatment in order to prevent mechanical damage at the glass surface of the dummies.

The relatively expensive glass dummies furthermore are sensitive to impact and surface wear. This known method for position fixation of the glass dummies therefore does not allow for a permanent process monitoring of assembly robots because of the aforementioned technological flaws.

It is an object of the invention to eliminate the disadvantages of the prior art.

SUMMARY OF THE INVENTION

The object of the present invention is solved by providing a testing element comprised of a protective housing and a transparent base body mounted in the protective housing. The transparent base body has a top surface and a base surface whereby at least at one of the surfaces machine-readable markings are provided. The testing element has adhesive means with which the testing element is connectable to a testing board.

The testing element (dummy) is comprised of a transparent base body having at the base surface and/or the top surface machine-readable markings. The base body is embedded in a protective housing that is designed to protect the base body against mechanical damage. In a preferred embodiment, the housing is an open frame which surrounds the base body at its circumferential sides. In another preferred embodiment the base body is surrounded by a frame and a cover that protects the top surface and is provided with openings or penetrations that allow passage of light.

In another preferred design of the base body the protective housing is a two-part frame whereby the two frame parts are detachably connected to the base body.

The base body is preferably comprised of glass, especially of high quality (pure) flat quartz glass. The housing that supports the base body is comprised preferably of a light-absorbent material (non transparent) that provides excellent contrast to the photo-optical sensing of the markings at the base body by incident light or transmitted light methods.

Preferably, the base body is comprised of an injection-molded plastic material or an aluminum diecast alloy. Advantageously, the surface of the base body is provided with a light-absorbing layer in order to avoid reflection or diffraction of the light beam during the photo-optical sensing of the markings on the dummy.

The advantageously frame-shaped edges of the housing which in the mounted state are facing the testing board, project 0.05 mm to 0.25 mm past the base surface of the base body embedded in the housing. The edges of the housing which during simulated positioning are to be placed onto the glass testing plate are coated partially, especially by spot distribution, or completely with a permanent-elastic adhesive.

Preferably, glass-clear transparent transfer adhesives are used. Since the adhesive layer is applied only onto the edge portions of the housing, the beam passage of an up and down camera will not be interrupted or deflected because no adhesive is positioned between the markings of the dummy, which provide the correct measurements, and the markings of the adjacent testing board.

For a position determination of the dummies on the testing board, machine-readable markings are provided on or at the dummy and are used for detecting position and shape deviations of the dummies placed onto the testing board.

One advantage of the new testing element is it high resistance with respect to impact loads as well as surface wear. The enclosure of the transparent base body which supports the markings (correct measurements) a safe and destruction-proof transmission of mechanical forces and moments is realized.

The projecting edge of the housing at the base surface of the dummies avoids a direct mechanical contact of the base body, preferably made of glass, of the dummy with a testing board.

By employing solvent-free, permanent-elastic adhesives cleaning of the testing board as well as cleaning of the employed glass dummies before performing a further measuring test is essentially eliminated.

The adhesive is applied in spots or over a large surface area at the underside of the housing which faces the testing board. By selecting a suitable adhesive, for example, the microporous adhesive 4656 of the Scotch Company, 3M, the measuring dummy can be used essentially for an unlimited time period as a simulation object. In practical long term testing it was found that a new adhesive coating of the housing of the glass dummy had to be applied only after a couple hundred test series.

The uniform homogenous adhesive prevents measuring errors of the first order resulting from tilting or slanting of the glass dummies relative to the surface of the testing board. The local application of the adhesive onto the edges of the housing of the glass dummies simulates flowing properties which are very similar to the behavior of real components. The placement of SMD circuits onto a printed circuit board to which a soldering paste or another soldering component has been applied is very similar to the positioning behavior of the dummy on a testing board.

A further advantage is the improved manipulation of the encapsulated end and thus breakage-proof dummy under real production conditions. The protective function of the housing allows for an extremely thin embodiment of the glass base body which is the measuring and position normal (standard). This allows for an increased resolution and more precise measuring-technological detection of the markings on the glass body.

Advantageously, the housing is produced of an impact-resistant as well as wear-resistant plastic material.

In a manufacturing technologically advantageous variant the one-part housing is produced by injection molding. This allows for a minimization of the manufacturing costs while maintaining sufficient manufacturing tolerances. Due to the elasticity of the plastic material, the base body can be positive-lockingly embedded in the interior of the housing. In an alternative embodiment the connection of the base body to the housing is provided by a high quality glass-clear transfer adhesive.

The housing of the testing element can also be produced as a diecast aluminum part. This also allows for sufficiently precise manufacturing tolerances with low production cost per housing so that a subsequent machining of the receiving surfaces of the housing is no longer required.

It is also possible by variation of the alloy components or by embedding mass particles to vary the total mass of the testing element in order to simulate actually occurring static and dynamic forces and moments during assembly of a real printed circuit by assembly robots.

In another advantageous embodiment, the inner walls of the housing which receive the base body are provided with a light-absorbing layer. This prevents reflection and diffraction of the sensing light beam which impinges on the inner wall of the housing.

In order to be able to employ the testing element also for measurements according to the transmitted light principle, the housing advantageously has at least one recess which allows for unimpeded passage of the light beam coming from a light source, which is positioned below the testing board, to a camera positioned above.

The adhesive that serves for fixation of the testing element on the testing board is advantageously applied to the underside of the housing in a spot distribution, especially on the projecting surface of the support. The spot distribution of the adhesive allows for removal of the dummies from the testing board after completion of a testing series with minimal force application manually or by a machine.

Also advantageous is the application of the adhesive over the entire surface of the support. This can simulate the actual positioning behavior of SMD flat component which rests under real process conditions on a layer of viscous soldering paste.

The adhesive is advantageously a pressure-sensitive support-free transfer tape. This allows the adjustment of the adhesive forces between adhesive and support of the housing, on the one hand, and the surface of the testing board, on the other hand, such that the adhesive after removal of the testing element from the testing plate remains securely on the support.

Since the transfer adhesive that is preferably used is free of solvents, no toxic by products will result which require additional venting of the working area at the assembly robot during testing.

It has been proven to be especially advantageous when the base surface of the base body (1) in the embedded state in the housing (2) is spaced approximately 0.05 mm to 0.25 mm from the surface of the testing board. By minimizing this spacing between the base surface (1g) of the base body (1), which has the machine-readable markings, and the surface of the neighboring testing board, tilting errors during measurement, respectively, testing are avoided to the greatest possible extent.

The possible tilting errors can be completely eliminated when in an advantageous embodiment the base surface and the top surface (1g), (1d) of the base body (1) are provided with machine-readable markings that are aligned with one another. In combination with a third marking provided at the surface or near the surface of the transparent testing board, tilting or slanting errors of the testing element can be reliably detected and localized.

A possibly required cleaning of the dummies can be performed advantageously such that the wear-sensitive base surface of the base body is provided or covered with a thin-walled plate of approximately 0.1 mm thickness which is positive-lockingly positioned between the projecting edges of the housing. Subsequently, adhesive remains or contaminations can be removed from the support surface of the housing by known mechanical, biological, and/or chemical means.

BRIEF DESCRIPTION OF THE DRAWINGS

The object and advantages of the present invention will appear more clearly from the following specification in conjunction with the accompanying drawings, in which:

FIG. 1a shows a section of a first embodiment of the testing element;

FIG. 1b shows a top view of the first embodiment of the testing element;

FIG. 2c shows a bottom view of the testing element of FIG. 2a;

DESCRIPTION OF PREFERRED EMBODIMENTS

Figure 2A:
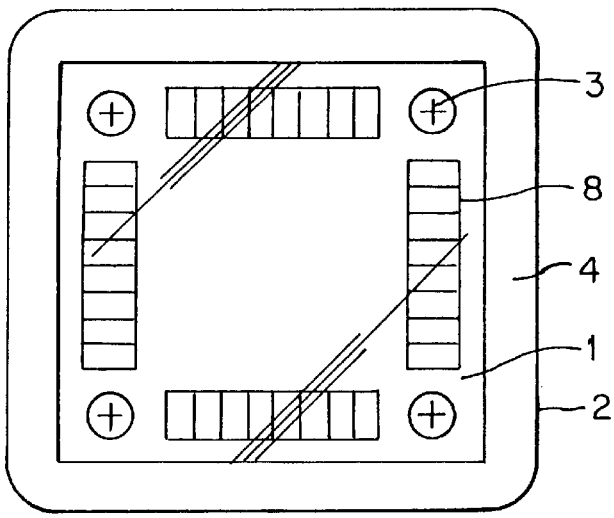
FIG. 2a shows a top view of a second embodiment of the testing element.

The present invention will now be described in detail with the aid of several specific embodiments utilizing FIGS. 1a through 3b.

FIG. 1a shows in a sectional view and FIG. 1b shows in a plan view a two-part testing element. The base body 1 is embodied by a 0.3 mm square quartz glass plate (highly pure $SiO_2$) having a size of 19 by 19 mm.

The quartz glass plate is positive-lockingly embedded in a one-part housing 2 made of plastic material. The frame-shaped housing 2 has at its underside a circumferential collar 5 on which the base surface 1g of the base body 1 rests. This provides for a precise and plan-parallel alignment of the base body 1 relative to the circumferential support 4 of the housing 2. The height of the collar 5 is 0.1 mm. By providing the minimal spacing between the base surface 1g of the base body 1 and the neighboring surface (not represented) of a glass testing board, measuring errors during the optical sensing of the markings 3 of the base body 1 are minimized.

In order to prevent measuring errors of the first order from occurring, which result from slanted placement of the testing element onto the testing board (for example, as a result of contaminations at the surface or of a non-uniform thickness of the applied adhesive), the top surface 1d of the base body in a preferred embodiment is also provided with markings 3 which are aligned with the markings 3 on the base surface 1g of the base body 1.

The circumferential collar 6 of the housing 2 protects the top surface 1d of the base body 1 against mechanical damage.

For a scheduled cleaning of the testing element from contamination, the base body 1 is removed from the elastic housing 2 by applying light pressure. Subsequently, the base body 1 and the housing 2 can be cleaned with ultrasound to remove adhered contaminants and particles. The subsequent mounting of the two components (1,2) of the testing element is performed in reverse order.

Figure 2B:
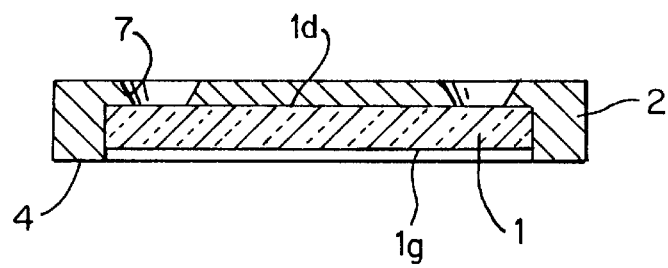
FIG. 2b shows a section along line IIb—IIb of FIG. 2c.
Figure 2C:
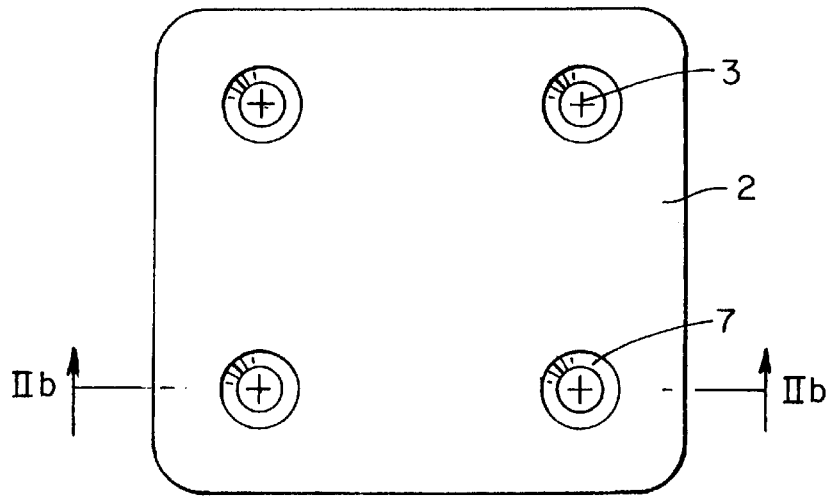

FIG. 2a through FIG. 2c show a further embodiment of the testing element. The base body 1 is embodied as a rectangular plate of optical glass having a thickness of 0.1 mm. On the base surface 1g of the base body 1 four markings 3 are provided which serve as a position determination for the testing element on the testing board. Simulation patterns 8 are applied on the base surface 1g in addition to the markings 3. The four symmetrically arranged simulation patterns 8 indicate the arrangement of pins of a real circuit. The simulation patterns 8 may represent the position of the pins relative to penetrations or soldering locations at the testing board positioned beneath.

The glass base body 1 is impact protected in the housing 2 made of diecast aluminum alloy AlMgSi9. The base body 1 and the housing 2 are connected by a non-represented glass-clear transparent transfer adhesive.

The housing 2 has at its lower edge a circumferential support 4 which is provided with a continuous layer of a microporous, permanent-elastic adhesive (10). This adhesive layer (10) allows a repeated positioning of the testing element, for example, when performing multiple tests without the adhesive layer (10) having to be renewed. After reaching a predetermined period of use, a preventive renewal of the adhesive layer (10) can be performed in order to remove possible contaminations which might have become embedded in the adhesive layer (10). The scheduled renewal of the adhesive layer (10) can prevent measuring errors which result from a non-uniform layer thickness of the adhesive applied onto the support of the housing.

The surface of the housing 2 is completely covered with a light absorbing black anodized layer (Eloxal). This prevents deflections of the light beam within the housing 2 during sensing of the markings 3.

Cleaning of the testing element can be performed with mechanical means or by employing a biological or chemical cleaner. As a protection for the base surface 1g of the base body it is covered by a non-represented protective plate which is insertable in a positive-locking arrangement into the inner frame of the housing 2, i.e., the circumferential support 4 projecting in the downward direction.

In FIG. 2b truncated cone-shaped recesses 7 are shown. These recesses 7 can be used for guiding the sensing light beam of a respective light source through the testing element according to the transmitted light process and can thus penetrate to reach the adjacent testing board and the receiver (camera). The spacing between the base surface 1g of the base body 1 and the support surface of the circumferential support 4 is 0.05 mm.

FIG. 2c shows the testing element in a plan view. The recesses 7 show the markings 3 that are provided at the base surface 1g of the base body.

Figure 3A:
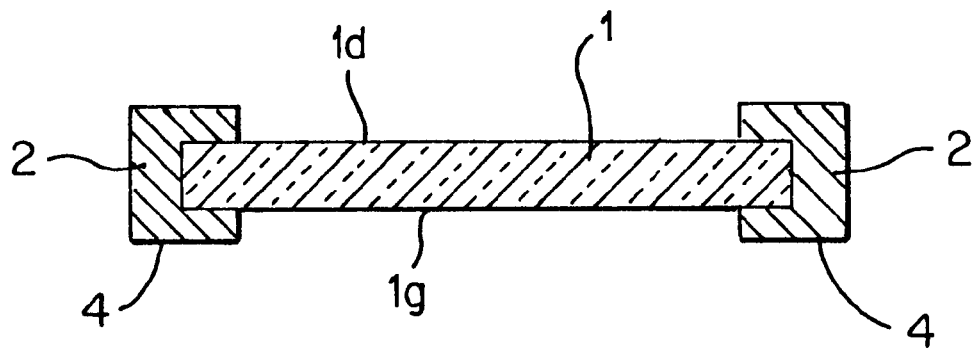
FIG. 3a shows a sectional view along the line IIIa—IIIa of FIG. 3b.
Figure 3B:
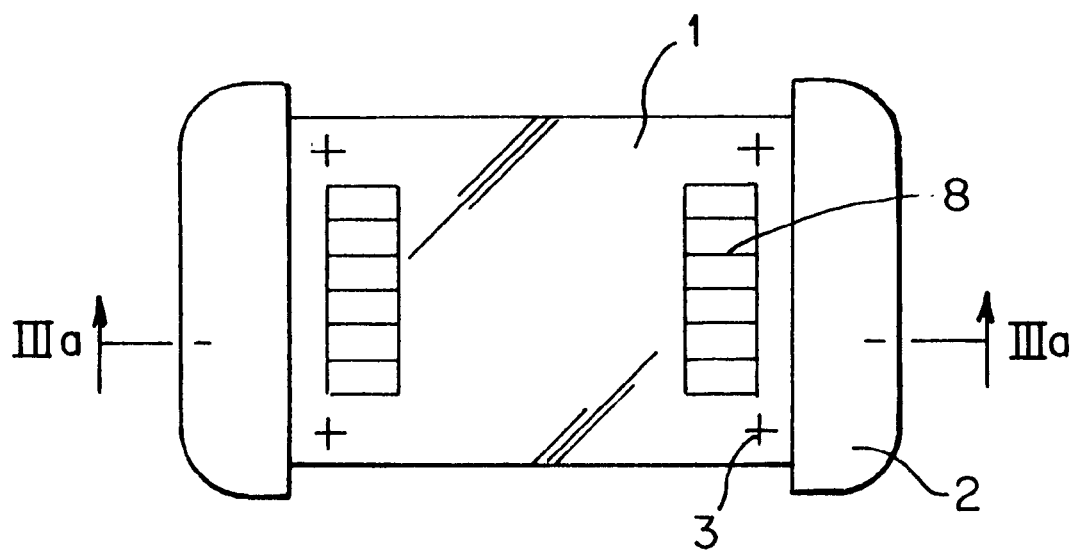
FIG. 3b shows a top view of a third embodiment of the testing element.

In a third embodiment according to FIGS. 3a through 3b the base body is comprised of a rectangular plane-parallel float glass plate of 0.5 mm thickness.

The protection of the base body 1 against mechanical impacts is provided by two pocket-shaped, U-shaped housing parts which can be slipped in a form-locking manner onto the ends of the rectangular base body 1 as shown in FIG. 3b. The position fixation of the testing element on the testing board, a shown in the embodiment of FIGS. 1a through 1b, is achieved by a transfer adhesive layer (10) that is applied to the support surface 4 of the two housing parts 2.

A scheduled or optional preventive cleaning of the testing element is carried out by removal of the two form-lockingly attached plastic housing parts 2 from the base body 1. Subsequently, the parts 1, 2 are cleaned by known means. Subsequently, the frame-like housing parts are again connected to the base body 1 and a new adhesive layer (10) is applied onto the support 4 of the housing parts 2.

The specification incorporates by reference the disclosure of German priority document 197 48 844.7 of Nov. 5, 1998.

The present invention is, of course, in no way restricted to the specific disclosure of the specification and drawings, but also encompasses any modifications within the scope of the appended claims.

What is claimed is:

1. A dummy component for mounting on a glass testing board for detecting positioning and mounting tolerances for robotic assembly devices, said dummy component comprising:

a protective housing (2);

a transparent base body (1) mounted onto said protective housing (2);

said transparent base body (1) having a top surface (1d) and a base surface (1g);

at least one of said base surface (1g) and said top surface (1d) having machine-readable markings (3); and an adhesive means for removably affixing said protective housing to said glass testing board.

2. The invention of claim 1, wherein said protective housing (2) comprises plastic.

3. The invention of claim 1, wherein said protective housing (2) comprises an aluminum alloy.

4. The invention of claim 1, wherein said protective housing (2) comprises walls surrounding said transparent base body (1) and wherein said walls are at least partially light-absorbent.

5. The invention of claim 1, wherein said protective housing (2) comprises recesses (7) allowing passage of radiation through said dummy component.

6. The invention of claim 1, wherein said protective housing (2) comprises at least one support (4) to which said adhesive means is affixed.

7. The invention of claim 6, wherein said adhesive means comprises spot application of an adhesive.

8. The invention of claim 6, wherein said adhesive means comprises a large surface area application of an adhesive.

9. The invention of claim 6, wherein said at least one support (4) comprises a circumferential frame.

10. The invention of claim 1, wherein said adhesive means comprises a double-sided self-adhesive tape comprising a pressure-sensitive adhesive.

11. The invention of claim 1, wherein said adhesive means comprises a permanent-elastic, microporous tape.

12. The invention of claim 1, wherein said adhesive means comprises an adhesive pad.

13. The invention of claim 6, wherein said support (4) projects in a range from 0.05 mm to 0.25 mm from said base surface (1g).

14. The invention of claim 1, wherein said base body (1) comprises flat silicon glass.

15. The invention of claim 1, wherein said base surface (1g) and said top surface (1d) have said machine-readable markings (3) and wherein said machine readable markings (3) of said top surface (1d) are aligned with said machine-readable markings (3) of said base surface (1g).

* * * * *

UNITED STATES PATENT AND TRADEMARK OFFICE
CERTIFICATE OF CORRECTION

PATENT NO. : 6,134,975
DATED : October 24, 2000
INVENTOR(S) : Mathias Keil

It is certified that error appears in the above-identified patent and that said Letters Patent is hereby corrected as shown below:

<u>Title page,</u>
The following item should read as follows:

[73] Assignee:
Cyberton Gesselschaft für Automation und
Quälitatsanalyse GmbH

Signed and Sealed this

Tenth Day of July, 2001

Attest:

NICHOLAS P. GODICI
Attesting Officer
Acting Director of the United States Patent and Trademark Office